United States Patent [19]

Chida et al.

[11] Patent Number: 4,812,698

[45] Date of Patent: Mar. 14, 1989

[54] PIEZOELECTRIC BENDING ACTUATOR

[75] Inventors: Yukio Chida; Tetsuhiko Nishimura; Yasuo Oguri, all of Yokohama, Japan

[73] Assignee: Mitsubishi Chemical Industries Limited, Tokyo, Japan

[21] Appl. No.: 102,397

[22] Filed: Sep. 29, 1987

[30] Foreign Application Priority Data

Sep. 29, 1986 [JP] Japan .................................. 61-228426
Dec. 27, 1986 [JP] Japan .................................. 61-309189
Dec. 27, 1986 [JP] Japan .................................. 61-309190

[51] Int. Cl.$^4$ ............................................. H01L 41/08
[52] U.S. Cl. ..................................... 310/330; 310/331; 310/332; 310/328; 310/358; 310/366
[58] Field of Search ................................ 310/330–332, 310/328, 358, 359

[56] References Cited

U.S. PATENT DOCUMENTS

| | | | |
|---|---|---|---|
| 3,370,187 | 2/1968 | Straube | 310/330 |
| 4,140,936 | 2/1979 | Bullock | 310/328 |
| 4,593,160 | 6/1986 | Nakamura | 310/332 X |

FOREIGN PATENT DOCUMENTS

| | | | |
|---|---|---|---|
| 0070787 | 6/1977 | Japan | 310/330 |
| 6042637 | 9/1985 | Japan . | |

Primary Examiner—Mark O. Budd
Attorney, Agent, or Firm—Oblon, Fisher, Spivak, McClelland & Maier

[57] ABSTRACT

A piezoelectric actuator comprising a longitudinal effect-type laminated piezoelectric element composed of piezoelectric ceramic sheets laminated in their thickness direction, and a supporting member fixed to one side in the longitudinal direction of the element and being bending and capable of constraining expansion of the element.

9 Claims, 6 Drawing Sheets

PIEZOELECTRIC BENDING ACTUATOR

The present invention relates to a piezoelectric actuator which is capable of providing a large displacement at the end tip of cantilever and a large generated force.

FIGS. 3 to 6 show conventional piezoelectric actuators.

Figure 3:
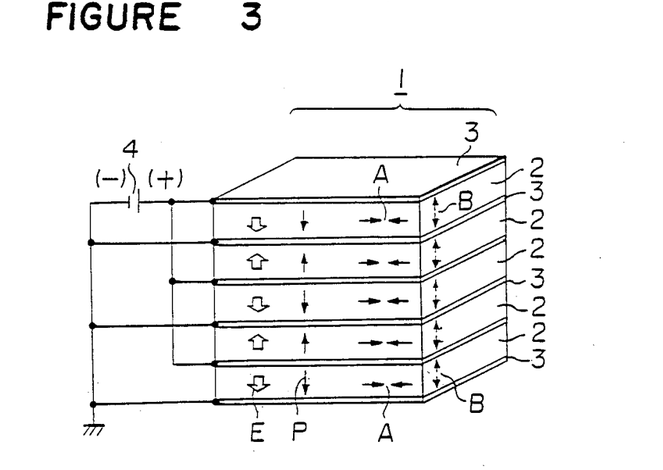
FIG. 3 is a perspective view of a longitudinal effect-type laminated piezoelectric actuator.

FIG. 3 is a perspective view of a longitudinal effect-type laminated piezoelectric actuator, wherein reference numeral 1 indicates the entire structure of a longitudinal effect-type laminated piezoelectric element (hereinafter referred to simply as a piezoelectric element 1), numeral 2 indicates a piezoelectric ceramic sheet, numeral 3 indicates an electrode, and numeral 4 indicates a power source, whereby an electric field E is applied to each piezoelectric ceramic sheet 2 via the electrode 3. Symbol P indicates the polarization direction of each piezoelectric ceramic sheet. Arrow A indicates the direction of contraction of the piezoelectric ceramic sheet 2 upon the application of the electric field E, and arrow B indicates the direction of expansion of the piezoelectric ceramic sheet 2.

Thus, the piezoelectric element 1 is composed of several hundred piezoelectric ceramic sheets 2 each having a thickness of from 50 to 100 $\mu$m, laminated in their thickness direction and designed to utilize the longitudinal effect whereby the entire element expands in a longitudinal direction upon the application of the electric field E in the same direction as the polarization direction P.

Figure 4:
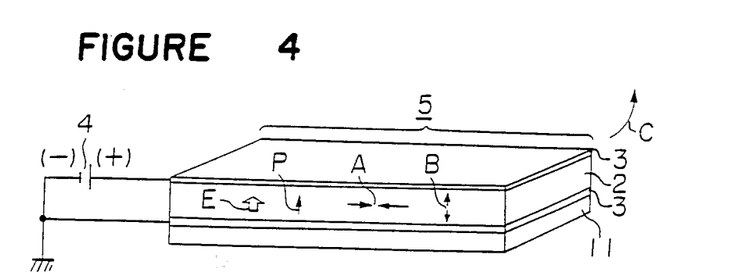
FIGS. 4, 5 and 6 are perspective views of unimorph-type, bimorph-type and multimorph-type transversal effect-type piezoelectric actuators, respectively.

FIG. 4 is a perspective view of a transversal effect-type piezoelectric actuator which is referred to as a unimorph-type. In this Figure, the same reference symbols as used in FIG. 3 indicate the same elements, and reference numeral 5 indicates a transversal effect-type piezoelectric element (hereinafter referred to simply as a piezoelectric element 5), numeral 6 indicates a piezoelectric ceramic sheet, and numeral 11 is a bending metal plate bonded to one side of the piezoelectric ceramic sheet 6 with the above-mentioned electrode 3 interposed therebetween.

Thus, the piezoelectric element 5 is composed of a piezoelectric ceramic sheet 6 having a thickness of from 100 to 500 $\mu$m and a metal plate 11 bonded to one side thereof, and it is of type to be flexed in the direction of arrow C by the transversal effect whereby it expands in the thickness direction upon the application of the electric field E in the same direction as the polarization direction P of the piezoelectric ceramic sheet 6.

Figure 5:
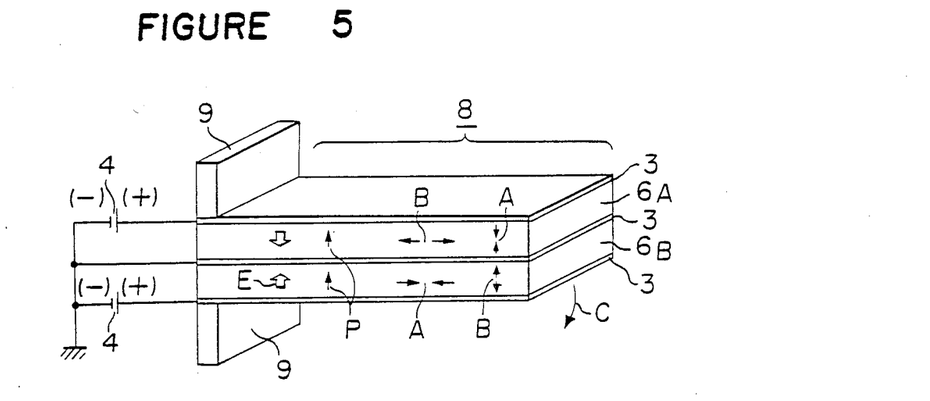

FIG. 5 is a perspective view of a transversal effect-type piezoelectric actuator which is referred to as a bimorph-type. In this Figure, the same reference symbols as in FIG. 4 indicate the same elements, and reference numerals 6A and 6B indicate piezoelectric ceramic sheets, numeral 8 indicates a transversal effect-type piezoelectric element (hereinafter referred to simply as a piezoelectric element 8), and numeral 9 is a fixing means for fixing the piezoelectric element 8. In this embodiment, the piezoelectric element 8 is composed of piezoelectric ceramic sheets 6A and 6B each having a thickness of from 100 to 500 $\mu$m bonded directly or with a metal intermediate electrode sheet interposed therebetween to facilitate leading out of an electrode, and it is of a type to be flexed in the direction of arrow C by the application of the electric field E to the piezoelectric ceramic sheet 6A in a direction opposite to the polarization direction P and to the other piezoelectric ceramic sheet 6B in the same direction as the polarization direction P.

Figure 6:
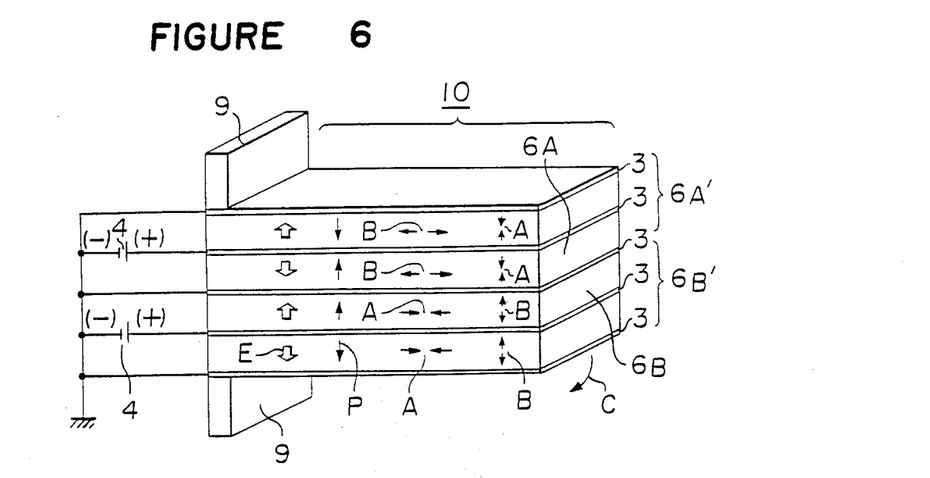

FIG. 6 is a perspective view of a transversal effect-type laminated piezoelectric actuator which is referred to as a multimorph-type. In this Figure, the same reference symbols as in FIG. 5 indicate the same elements, and reference numeral 10 indicates a transversal effect-type laminated piezoelectric element of multimorph-type (hereinafter referred to simply as a piezoelectric element 10).

Thus, the piezoelectric element 10 has a structure wherein a plurality, two each in the illustrated case, of piezoelectric ceramic sheets 6A and 6B as used in the transversal effect-type piezoelectric element in FIG. 5, are laminated, and it is of a type to be flexed in the direction of arrow P by the application of the electric field E to a piezoelectric element 6A' at an upper portion above the center of the piezoelectric element 10 in a direction opposite to the polarization direction P and to a piezoelectric element 6B' at a lower portion in the same direction as the polarization direction P.

The conventional longitudinal effect-type laminated piezoelectric actuator as shown in FIG. 3 has a problem such that the displacement $\delta$ at the end tip of cantilever is very small at a level of a few ten $\mu$m or less although the generated force F can be as large as a few hundred kg/mm$^2$.

On the other hand, the unimorph-type piezoelectric actuator as shown in FIG. 4 is usually used as an oscillator for a piezoelectric buzzer, and the technique for designing such an oscillator has been almost fully established by now. However, in an application where no oscillation is utilized as in the case of an actuator or in a case where low frequency driving is conducted, no design has been disclosed to bring e.g. the thicknesses of the piezoelectric element and the bending supporting member to the optimum for obtaining a large displacement at the end tip of cantilever and a large generated force simultaneously.

The bimorph-type piezoelectric acturator of a double layer structure (no intermediate sheet) as shown in FIG. 5 is prepared usually by bonding a pair of piezoelectric ceramic sheets made of the same material and having the same size (and thickness). Also in this case, no product has been disclosed which is capable of providing a large displacement at the end tip of cantilever and a large generated force simultaneously.

Namely, the transversal effect-type piezoelectric actuators as shown in FIGS. 4 to 6 are superior in the displacement at the end tip of cantilever by virtute of the bending mode as compared with the longitudinal effect-type piezoelectric actuators, and the displacement $\delta$ at the end tip of cantilever is as large as a few hundred $\mu$m, but the constraint generating force is conversely very small at a level of from a few gf to a few tens gf. In the case of the transversal effect-type piezoelectric actuators, the constraint force may be increased either by increasing the thickness of the piezoelectric ceramic sheet 6 or by reducing the length of the piezoelectric element. However, there has been a problem that the displacement $\delta$ at the end tip of cantilever is inversely proportional to the thickness and decreases in proportion to the square of the length of the piezoelectric element.

More specifically, with respect to the bimorph-type as shown in FIG. 5, the relations of the displacement $\delta$ at the end tip of cantilever and the constraint generated force F are represented by the following equations:

$$\delta = \frac{3l^2 \cdot d_{31} \cdot E}{4t} \tag{1}$$

$$F = \frac{3bt^2 \cdot Y \cdot d_{31} \cdot E}{2l} \tag{2}$$

where l: effective length of the piezoelectric ceramic sheet 6, $d_{31}$: piezoelectric strain coefficient, E: electric field intensity, t: thickness per layer, b: width of the piezoelectric ceramic sheet 6, and Y: Young's modulus. The applied voltage V=Et.

With respect to a multimorph-type as shown in FIG. 6, the corresponding relations are represented by the following equations:

$$\delta = \frac{3l^2 \cdot d_{31} \cdot E}{4 \cdot N \cdot t} \tag{3}$$

$$F = \frac{3b \cdot N^2 \cdot t^2 Y^{d_{31}} E}{2l} \tag{4}$$

where N: number of laminated pairs, and other symbols are the same as in the equations (1) and (2).

Thus, it is possible to increase the displacement δ at the end tip of cantilever and the constraint generated force F simultaneously either by using a material having a large piezoelectric strain coefficient ($d_{31}$, $d_{33}$) or by intensifying the applied electric field.

However, it is very difficult to find a new material having a high piezoelectric strain coefficient ($d_{31}$, $d_{33}$) since such an aspect has already been extensively explored by now.

The bimorph-type has been devised since no adequate displacement δ at the end tip of cantilever and constraint generated force F have been obtained by the unimorph-type as shown in FIG. 4 among the transversal effect-type piezoelectric actuators.

However, in the case of the bimorph-type, it is necessary to apply the electric field E in a direction opposite to the polarization direction P, and the intensity of the electric field E is limited to a level at which no depolarization takes place. Namely, with the bimorph-type, the electric field E applicable is at a level of only 500 V/mm at best, while the allowable electric field E applied in the same direction as the polarization direction P is at a level of from 1 to 2 kV/mm (i.e. the level of the electric field E at which no dielectric breakdown takes place). For this reason, even with the bimorph-type, it is difficult to obtain sufficiently large displacement δ at the end tip of cantilever and constraint generated force F simultaneously although the displacement at the end tip of cantilever and constraint generated force thereby obtainable are larger than those obtainable by the unimorph-type.

It is an object of the present invention to solve the above-mentioned problems and to provide a piezoelectric actuator capable of providing a large displacement at the end tip of cantilever and a large force simultaneously by making it possible to apply a high intensity electric field to a piezoelectric ceramic element and whereby it is possible to reduce or minimize the electric field intensity required for such purpose.

The present invention provides a piezoelectric actuator comprising a longitudinal effect-type laminated piezoelectric element composed of piezoelectric ceramic sheets laminated in their thickness direction, and a supporting member fixed to one side in the longitudinal direction of the element and being bending and capable of constraining expansion of the element.

Now, the present invention will be described in detail with reference to the preferred embodiments.

In the accompanying drawings:

FIGS. 3 to 6 show conventional piezoelectric actuators, namely.

In the piezoelectric actuator of the present invention, a supporting member made of a non-piezoelectric bending plate capable of constraining expansion or contraction of a longitudinal effect-type laminated piezoelectric element or a supporting member made of a transversal effect-type piezoelectric element contractible in a direction opposite to the direction of expansion of the longitudinal effect-type laminated piezoelectric element, is fixed to one side in the longitudinal direction of the longitudinal effect-type laminated piezoelectric element composed of piezoelectric ceramic sheets laminated in their thickness direction. It is preferred in the case of the unimorph-type actuator that the Young's modulus of the supporting member is at least 2.5 times the Young's modulus of the piezoelectric element; the thickness $t_2$ of the piezoelectric element is within a range of 100 $\mu m \leq t_2 \leq 5000$ $\mu m$; and the ratio of $t_2/t_1$ where $t_2$ is the thickness of the piezoelectric element and $t_1$ is the thickness of the supporting member, is at least 1.6.

More preferably, the thickness $t_2$ of the piezoelectric element and the thickness $t_1$ of the supporting member satisfy the following formulas I and II, repectively:

$$100 \ \mu m \leq t_2 \leq 5000 \ \mu m \tag{I}$$

$$\sqrt{\frac{Y}{2}} \ t_2 \ \mu m \leq t_1 \leq 2 \sqrt{Y} \ t_2 \ \mu m \tag{II}$$

where $Y = Y_2/Y_1$ where $Y_2$ is the Young's modulus of the piezoelectric element and $Y_1$ is the Young's modulus of the supporting member.

Now, the present invention will be described in more detail with reference to the drawings.

Figure 1:
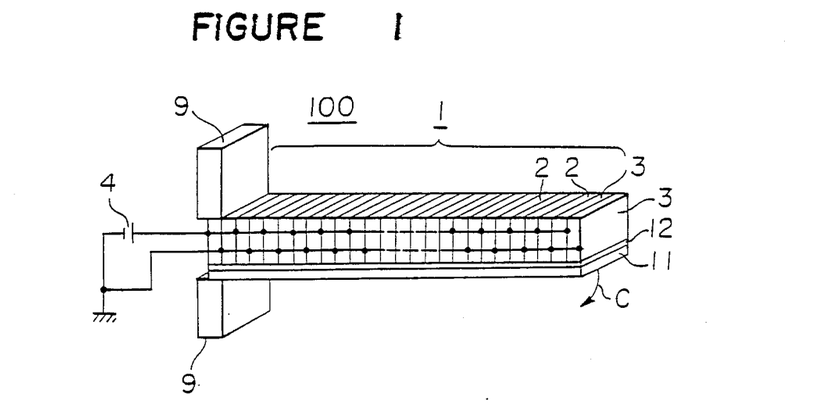
FIG. 1 is a perspective view of an embodiment of the present invention.

FIG. 1 is a perspective view of a unimorph-type piezoelectric actuator as an embodiment of the present invention, wherein the same reference symbols as used in FIG. 3 indicate the same elements, and reference numeral 100 indicates the unimorph-type piezoelectric actuator, which is a combination of a longitudinal effect-type laminated piezoelectric element 1 (hereinafter referred to simply as a piezoelectric element 1) and a metal plate 11. Namely, the metal plate 11 is bonded to one side in the longitudinal direction of the piezoelectric element 1 (composed of a number of piezoelectric ceramic sheets laminated in their thickness direction in the same manner as illustrated in FIG. 3 and laid in the direction of lamination) by an insulating adhesive such as an epoxy resin to form an insulating layer 12. Although not shown in FIG. 1, the direction for the application of the electric field E, the polarization direction P, the contraction direction A and the expansion direction B are the same as in the case of the piezoelectric element 1 in FIG. 3.

Figure 2:
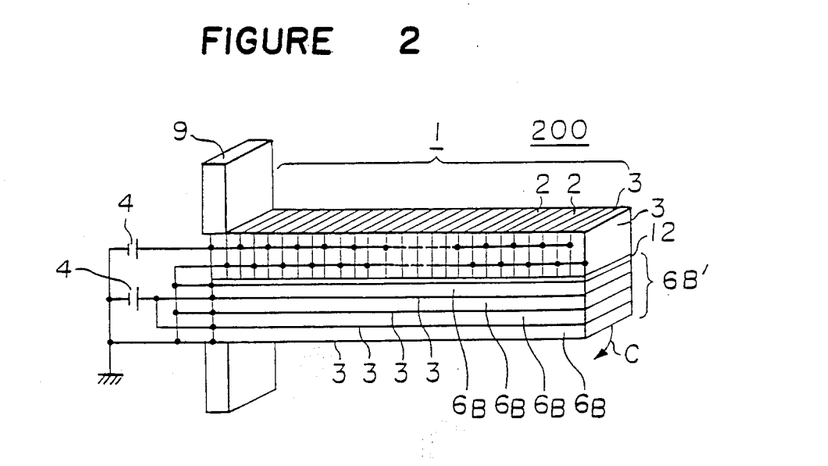
FIG. 2 is a perspective view of another embodiment of the present invention.

FIG. 2 is a perspective view of a bimorph-type piezoelectric actuator as another embodiment of the present invention, wherein the same reference symbols as in FIG. 1 indicate the same elements, and reference numeral 200 is the bimorph-type piezoelectric actuator, which is a combination of a longitudinal effect-type piezoelectric element 1 and a transversal effect-type laminated piezoelectric element 6B′ (hereinafter referred to simply as a piezoelectric element 6B′).

Although not shown in the Figure, the direction of the application of the electric field E, the polarization direction P, the contraction direction A and the expansion direction B are the same as in FIG. 3 with respect to the piezoelectric element 1 and are the same as in the case of the multimorph-type piezoelectric element 6B′ shown in FIG. 6 with respect to the piezoelectric element 6B′. A metal plate 11 as shown in FIG. 1 may be interposed between the insulating layer 12 and the piezoelectric element 6B′.

Now, for the preparation of the piezoelectric actuators 100 and 200, a powder of lead titanate zirconate (PZT) as a piezoelectric material and an organic binder are kneaded together with a plasticizer, a solvent, etc. to obtain a slurry, which is then moled into a sheet by means of e.g. a doctor blade and then dried. Then, the required electrode 3 is formed by screen printing. A plurality of the piezoelectric ceramic sheets thus prepared are laminated and press-bonded under heating to obtain a monolithic shaped product. The thickness of each piezoelectric ceramic sheet 2 and the number of laminated sheets correspond to the length of the piezoelectric element 1 and they are determined to obtain a necessary length of the element taking into the consideration the desired applied voltage, displacement at the end tip of cantilever, generated force, etc. The shaped product is then cut in a direction perpendicular to the direction of the electrodes 3 so that the thickness of the piezoelectric element 1 would be about from a few hundred $\mu$m to a few thousand $\mu$m and then sintered and subjected to necessary abrasive finishing to obtain a finished element composed of piezoelectric ceramic sheets 2 laminated in the longitudinal direction of the element.

Otherwise, the shaped product may be sintered as it is i.e. without cutting, and then, cut and subjected to abrasive finishing to obtain a piezoelectric element 1 in a similar fashion. To this, outer connecting electrodes are fixed with inner electrodes and a lead wire is connected thereto, followed by polarization treatment.

Then, in the case of the unimorph-type piezoelectric actuator 100 as shown in FIG. 1, an epoxy resin serving both as an insulating agent and as an adhesive is coated on a metal plate 11 made of e.g. a Fe-Ni alloy to form an insulating layer 12, and then, the metal plate 11 is bonded to the piezoelectric element 1.

In the case of the bimorph-type piezoelectric actuator 200 as shown in FIG. 2, a transversal effect-type laminated piezoelectric element 6B′ is sintered, then processed into a predetermined shape and subjected to polarization treatment, and thereafter an insulating layer 12 is formed in the same manner as in the case of the unimorph-type of FIG. 1. Then, the element 6B′ is bonded to the piezoelectric element 1. Further, in order to facilitate the leading out of the electrodes, a bending metal plate may be inserted as an intermediate electrode plate between the transversal effect-type laminated piezoelectric element 6B′ and the insulating layer 12 and simultaneously bonded.

In the piezoelectric actuator 200, a single layer transversal effect-type piezoelectric element 6B may be provided instead of the transversal effect-type laminated piezoelectric element 6B′ to obtain the same function and effects.

Although not shown in the Figure, the direction of the application of the electric field E, the polarization direction P, the contraction direction A and the expansion direction B are the same as in the case of the piezoelectric element 1 in FIG. 3.

The longitudinal effect-type piezoelectric element 1 of a plate form thus prepared by the above steps is applied to a bending mode to obtain a unimorph-type or bimorph-type piezoelectric actuator 100 or 200 having a large displacement at the end tip of cantilever and a large generated force F.

Thus, when the above piezoelectric element 1 is used for the unimorph-type piezoelectric actuator 100, the piezoelectric strain will be from 2 to 3 times greater than the conventional unimorph-type piezoelectric element 5 (i.e. $d_{33} \approx 2$ to $3 \times d_{31}$) Accordingly, the displacement $\delta$ at the end tip of cantilever and the generated force F will be from 2 to 3 times larger than the conventional transversal effect-type unimorph of the same shape.

On the other hand, when it is used for the bimorph-type piezoelectric actuator 200, the upper portion above the insulating layer 12 expands by means of the longitudinal effect-type piezoelectric element 1, and the lower portion below the insulating layer 12 contracts by means of the transversal effect-type piezoelectric element 6B′. By using this combination, it is possible to apply the electric field E to the piezoelectric elements 1 and 6B′ in the same direction as the polarizing direction P, whereby depolarization which used to be a drawback of the conventional bimorph-type does not take place, and it is possible to apply the electric field E with high intensity at a level where no substantial dielectric breakdown takes place.

Accordingly, it is unnecessary to apply a low electric field to each of the two piezoelectric elements in order to avoid the depolarization which used to be the most serious drawback of the conventional bimorph-type, or to take a trouble of preventing the depolarization by applying a high electric field in the same direction and a low electric field in the opposite direction. Namely, in the case of the conventional bimorph-type, the electric field applicable in the direction opposite to the polarization direction is at a level of only 500 V/mm at best. Whereas, when the piezoelectric actuator 100 or 200 of the present invention is used, it is possible to apply a high electric field E at a level of from 1 to 2 kV/mm.

Further, since a longitudinal effect-type piezoelectric element 1 is used in the same manner as in the unimorph-type, the piezoelectric strain will be from about 2 to about 3 times larger even when the same material as the conventional material is used ($d_{33} \approx 2$ to $3 \times d_{31}$). Thus, it is possible not only to apply an electric field E higher by from 2 to 10 times than the conventional actuator but also to utilize a piezoelectric strain larger by from 2 to 3 times, whereby both the displacement $\delta$ at the end tip of cantilever and the generated force F can be increased by from 4 to 30 times.

The supporting member is required to have a sufficient strength to constrain the expansion of the piezoelectric ceramic element and at the same time required to be bending. Further, when the supporting member is an electrically conductive material or a transversal effect-type piezoelectric ceramic material, it is necessary to interpose an insulating layer between it and the longitudinal effect-type piezoelectric element since electrodes are exposed on the surface of the longitudinal effect-type piezoelectric element. More specifically, the supporting member may be made of an oxide ceramic material such as alumina, zirconia, $MgAl_2O_4$, mullite, beryllia or cordierite; a non-oxide ceramic material such as SiC, $Si_3N_4$, AlN, $B_4C$, TiC or tungsten carbide; a metal plate such as an iron-nickel alloy; or a transversal effect-type piezoelectric ceramic element.

Further, it has been found possible to substantially reduce the required intensity of the electric field by adjusting the Young's modulus of the supporting member to a level of at least 2.5 times the Young's modulus of the piezoelectric element 1 to which it is bonded, the thickness $t_2$ of the piezoelectric element 1 within a range of 100 $\mu m \leq t_2 \leq 5000$ $\mu m$ and the ratio of $t_2/t_1$ where $t_2$ is the thickness of the piezoelectric element and $t_1$ is the thickness of the supporting member, to a level of at least 1.6. Namely, the Young's modulus of the two members preferably satisfy $Y_1 \leq 2.5 Y_2$ where $Y_1$ is the Young's modulus of the supporting member and $Y_2$ is the Young's modulus of the piezoelectric element. If the Young's modulus of the supporting member is less than 2.5 times the Young's modulus of the piezoelectric element, the reduction of the required intensity of the applied electric field is small. If the ratio in the thickness of the piezoelectric element to the supporting member is less than 1.6, not only the reduction in the required strength of the applied electric field decreases, but also a higher intensity of the applied electric field will be required because a supporting member having a high Young's modulus will be employed, such being disadvantageous.

Figure 7:
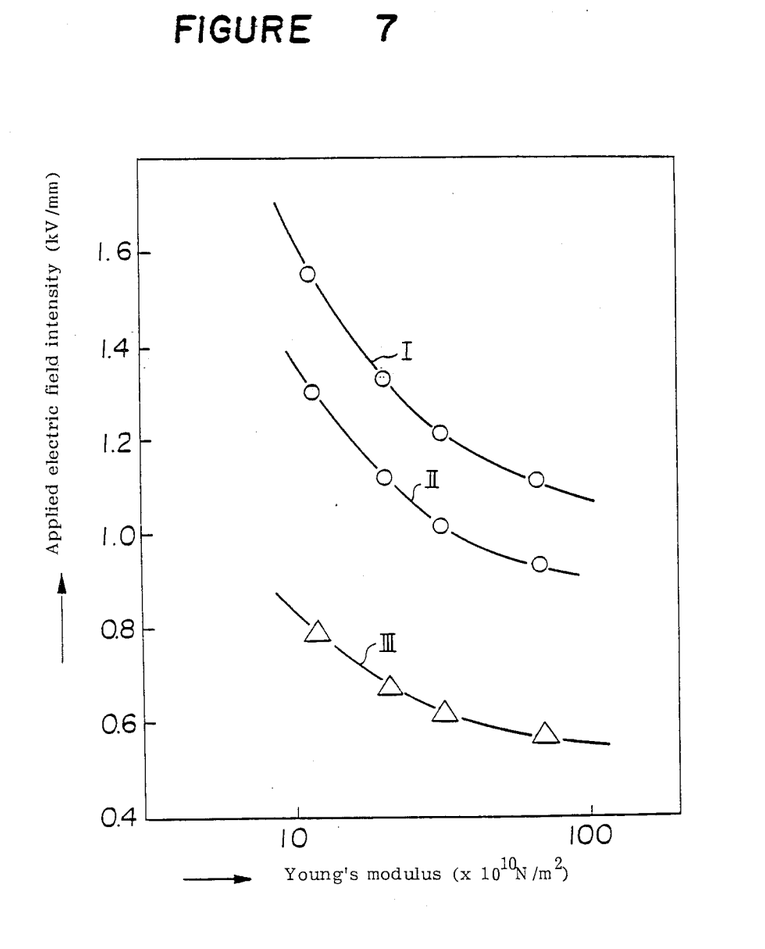
FIG. 7 shows the relation between the applied electric field intensity and the Young's modulus of supporting members in Examples of the present invention.

In FIG. 7, the relation between the Young's modulus $Y_1$ ($\times 10^{10}$ N/m²) of the supporting member and the electric field strength (kV/mm) for the desired displacement at the end tip of cantilever and generated force. The Young's modulus $Y_2$ of the piezoelectric element 1 was set to be $Y_2 = 5.9 \times 10^{10}$ N/m², and the thickness of the supporting member was 60 $\mu m$, the thickness of the piezoelectric element was 210 $\mu m$ (i.e. the ratio to the thickness is 3.5), the width of the piezoelectric element was 5 mm and the length of the piezoelectric element was 15 mm.

Curves I, II and III represent 500 $\mu m$/50 gf, 500 $\mu m$/30 gf and 250 $\mu m$/25 gf, respectively, of a unimorph-type.

As is evident from this Figure, when a supporting member 11 made of a material having a large Young's modulus $Y_1$, the prescribed levels of the displacement at the end tip of cantilever and the force can be obtained with a small level of the required strain ($d \times E$, where d: piezoelectric strain coefficient, and E: electric field).

Thus, if an electric field higher than this is applied, a larger generated force and displacement at the end tip of cantilever can be obtained.

Further, the larger the work load ($\frac{1}{2}\delta F$ where $\delta$: displacement at the end tip of cantilever and F: generated force), the higher the effect of the Young's modulus relative to the reduction of the necessary strain. Namely, the larger the work load, the more advantageous it becomes to use a material having a high Young's modulus.

Further, it has been found that the optimum combination of the thicknesses to minimize the required intensity of the applied electric field is as follows. Namely, $Y = Y_2/Y_1$ and $n = t_2/t_1$, where $Y_2$ is the Young's modulus of the piezoelectric element, $Y_1$ is the Young's modulus of the supporting member, $t_2$ is the thickness of the piezoelectric element and $t_1$ is the thickness of the supporting member. It has been found that the intensity of the applied electric field may be the minimum when the relation of the two is $n = t_2/t_1 = \sqrt{1/Y}$ i.e. $t_1 = \sqrt{Y} t_2$. Here, the optimum thickness $t_2$ is determined by the following equation:

$$t_2 = \sqrt[3]{\frac{\sqrt{1/Y}}{1 + \sqrt{1/Y}} \cdot \frac{Fl^3}{Y_2 \delta b}}$$

where F: generated force, $\delta$: displacement at the end tip of cantilever, l: length of the piezoelectric element, and b: width of the piezoelectric element. The influence of the electrodes or the adhesive layer is negligible since their thicknesses are usually very thin as compared with the thicknesses of the piezoelectric element and the supporting member.

Thus, a larger generated force and displacement at the end tip of cantilever can be obtained if it is possible to apply an electric field of a higher intensity.

The above conditions for $t_1$ and $t_2$ are the optimum. However, usually it is sufficient that the thickness $t_2$ of the piezoelectric element satisfies the following formula I, and the thickness $t_1$ of the supporting member satisfies the formula I:

$$100 \ \mu m \leq t_2 \leq 5000 \ \mu m \qquad (I)$$

$$\sqrt{\frac{Y}{2}} \ t_2 \ \mu m \leq t_1 \leq 2 \sqrt{Y} \ t_2 \ \mu m \qquad (II)$$

Now, specific shapes of the piezoelectric actuators 100 and 200 of the present invention and the measured values thereof will be described.

Table 1 shows the shape of each piezoelectric actuator 100 or 200 and the conditions for the measurement.

In reference to Table 1, the unimorph-type piezoelectric actuator 100 was fixed at one end, and the displacement $\delta$ at the end tip of cantilever and the generated force F at the other end were measured.

The displacement $\delta$ at the end tip of cantilever was measured by an eddy current system senser, and the generated force F was represented by the force whereby the displacement at the end tip of cantilever becomes 0.

The bimorph-type piezoelectric actuator 200 was measured in the same manner as described above. The results thereby obtained are shown in Table 2. The Comparative Examples in Table 2 will be described as follows:

COMPARATIVE EXAMPLE 1

The size of the piezoelectric element and the intensity of the applied electrical field were the same as in Example 1. However, as the piezoelectric element, instead of the longitudinal effect-type laminated element, a transversal effect-type element having the same length was used ($d_{31}=260\times10^{-12}$ m/v).

COMPARATIVE EXAMPLE 2

The size of the piezoelectric element was the same as in Example 2. However, as the piezoelectric element, instead of the longitudinal effect-type laminated element, a transversal effect-type element having the same thickness was used ($d_{31}=260\times10^{-12}$ m/v). The intensity of the applied electric field was 1 kV/mm in the same direction as the polarization direction and 0.4 kV/mm in the opposite direction.

TABLE 1

|  |  | Example 1 Unimorph-type piezoelectric actuator 100 | Example 2 Bimorph-type piezoelectric actuator 200 |
|---|---|---|---|
| Element size (length × width) (mm) | | 15 × 5 | |
| Thickness of piezoelectric ceramic element (μm) | Longitudinal effect-type laminated piezoelectric element portion | 200 Note 1 | |
| | Transversal effect-type piezoelectric element portion | — | 160 Note 2 |
| Thickness of metal plate (Fe—Ni alloy) (μm) | | 90 | |
| Adhesive | | Epoxy resin | |
| Intensity of applied electric field (kV/mm$^2$) | Longitudinal effect-type laminated piezoelectric element portion | 1 | 1 |
| | Transversal effect-type piezoelectric element portion | — | 1 |

Note 1: (100 μm/layer × 150 layers) Piezoelectric strain coefficient $d_{33} = 700 \times 10^{-12}$ m/v
Note 2: Piezoelectric strain coefficient $d_{31} = 260 \times 10^{-12}$ m/v

TABLE 2

|  | Unimorph-type piezoelectric actuator | | Bimorph-type piezoelectric actuator | |
|---|---|---|---|---|
|  | Example 1 | Comparative Example 1 | Example 2 | Comparative Example 2 |
| Displacement at the end tip of cantilever (δμm) | 520 | 180 | 620 | 200 |
| Generated force F (gf) | 49 | 16 | 58 | 23 |

In each of the following Examples, a longitudinal effect-type laminated piezoelectric ceramic element was used and the supporting member was varied. The width of the element was 5 mm, the length of the element was 15 mm, the thickness of the supporting member was 60 μm and the Young's modulus of the piezoelectric element was $5.9\times10^{10}$ N/m$^2$.

As Comparative Examples, there will be given a case wherein phosphor bronze was used as the supporting member to show an embodiment where $Y_1/Y_2<2.5$ and a case wherein the ratio of the thicknesses of the piezoelectric element and the supporting member is less than 1.6. The size of the element and the piezoelectric elements used were the same as in the Examples.

EXAMPLE 3

Supporting member: zirconia ($t_1=60$ μm)
Piezoelectric element: PZT ceramics ($t_2=210$ μm) ($d_{33}=720\times10^{-6}$ m/v), ($Y_1=2.1\times10^{11}$ N/m$^2$), $Y_1/Y_2=3.6$.
Applied electric field strength: 1.35 kV/mm.
Measured values: Displacement at the end tip of cantilever: 560 μm, Generated force: 47 gf.

EXAMPLE 4

Supporting member: alumina ($t_1=60$ μm).
Piezoelectric element: PZT ceramic element ($t_2=210$ μm), ($d_{33}=720\times10^{-12}$ m/v), ($Y_1=3.3\times10^{11}$ N/m$^2$), $Y_1/Y_2=5.6$.
Applied electric field intensity: 1.20 kV/mm.
Measured values: Displacement at the end tip of cantilever: 550 μm, Generated force: 48 gf.

EXAMPLE 5

Supporting member: tungsten carbide ($t_1=60$ μm).
Piezoelectric element: PZT ceramic element ($t_2=210$ μm), ($Y_1=6.9\times10^{11}$ N/m$^2$), $Y_1/Y_2=11.7$.
Applied electric field intensity: 1.10 kV/mm.
Measured values: Displacement at the end tip of cantilever: 560 μm, Generated force: 49 gf.
Piezoelectric strain coefficient $d_{33}=720\times10^{-12}$ m/V.
Piezoelectric strain coefficient $d_{31}=260\times10^{-12}$ m/V.

COMPARATIVE EXAMPLE 3

Supporting member: phosphor bronze ($t_1=60$ μm).
Piezoelectric element: PZT ceramic element ($t_2=210$ μm), ($Y_1=1.2\times10^{11}$ N/m$^2$), $Y_1/Y_2=2.0$.
Thickness of the supporting member, and thickness of the piezoelectric element: same as in the Examples.
Measured values: Displacement at the end tip of cantilever: 510 μm, Generated force: 45 gf.

It is evident in each of the Examples of the present invention, large displacement at the end tip of cantilever and generated force are obtainable with a low intensity of the applied electric field as compared with the Comparative Example.

COMPARATIVE EXAMPLE 4

Supporting members: alumina ($Y_1=3.3\times10^{11}$ N/m$^2$).
Piezoelectric element: PZT ceramic element ($Y_2=5.9\times10^{10}$ N/m$^2$).
Thickness of the supporting member: 140 μm ($Y_1/Y_2=5.6$).
Thickness of the piezoelectric element: 140 μm ($t_2/t_1=1.0$).
Applied electric field intensity: 1.70 kV/mm.
Measured values: Displacement at the end tip of cantilever: 520 μm, Generated force: 46 gf.

It is evident that in this Comparative Example, an electric field intensity higher than Example 3 wherein zirconia having a Young's Modulus lower than alumina is used, is required, and not only that, an electric field intensity higher than Comparative Example 3 wherein phosphor bronze is used, is required, such being disadvantageous.

EXAMPLE 6

Type: Unimorph.
Supporting member: alumina.
Piezoelectric element: PZT ceramic element ($d_{33} = 720 \times 10^{-2}$ m/v), m: 0.1778 [($Y_2 = 5.9 \times 10^{10}$ N/m$^2$)/($Y_1 = 3.3 \times 10^{11}$ N/m$^2$)], n: 2.365 [($t_2 = 200$ μm)/($t_1 = 85$ μm)],
Applied electric field intensity: 1.17 kV/mm.
Measured values: Displacement at the end tip of cantilever: 550 μm, Generated force: 48 gf.

Figure 8:
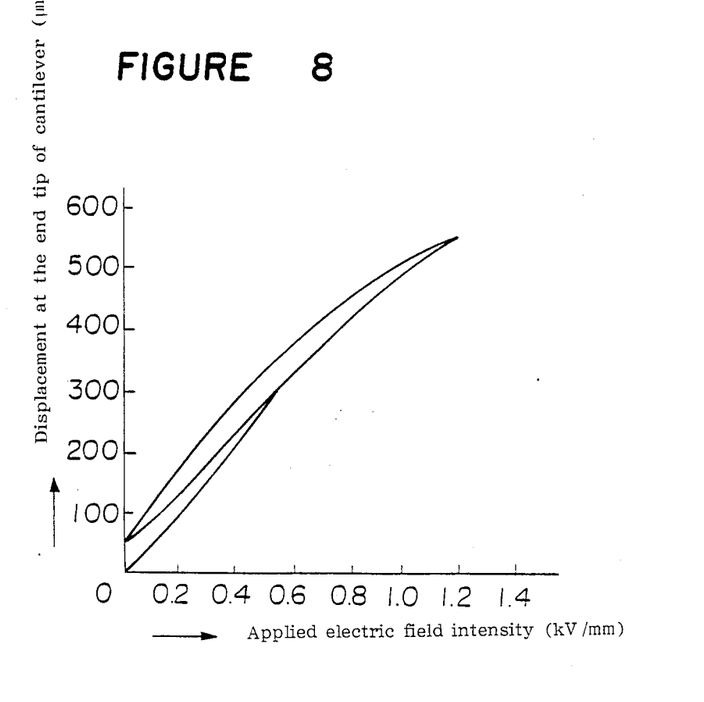
FIG. 8 shows the relation between the applied electric field intensity and the displacement at the end tip of cantilever as measured with respect to the unimorph-type actuator in Example 6.
Figure 9:
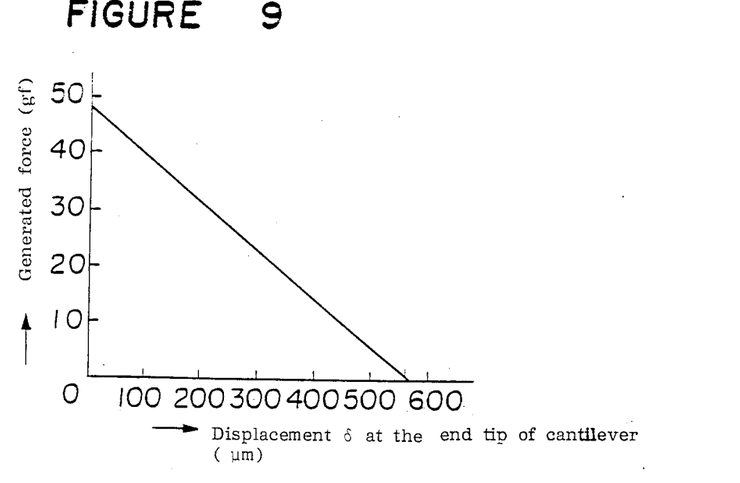
FIG. 9 shows the relation between the displacement at the end tip of cantilever and the generated force as measured with respect to the unimorph-type actuator in Example 6.

Further, FIG. 8 shows the relation between the applied electric field intensity and the displacement at the end tip of cantilever, and FIG. 7 shows the relation between the displacement at the end tip of cantilever and the generated force.

EXAMPLE 7

Type: Unimorph.
Supporting member: zirconia.
Piezoelectric element: PZT ceramic element ($d_{33} = 720 \times 10^{-12}$ m/V), Y: 0.2810 [($Y_2 = 5.9 \times 10^{10}$ N/m$^2$)/($Y_1 = 2.1 \times 10^{11}$ N/m$^2$)], n: 1.887 [($t_2 = 195$ μm)/($t_1 = 104$ μm)].
Applied electric field intensity: 1.25 kV/mm.
Measured values: Displacement at the end tip of cantilever: 560 μm, Generated force: 47 gf.
Piezoelectric coefficient: $d_{33} = 720 \times 10^{-12}$ m/V.

EXAMPLE 8

Type: Bimorph.
Supporting member: transversal effect-type.
Piezoelectric element: PZT ceramic element ($d_{31} = 260 \times 10^{-12}$ m/V).
Piezoelectric element: PZT ceramic element ($d_{33} = 720 \times 10^{-12}$ m/V). Y: 0.8806 [($Y_2 = 5.9 \times 10^{10}$ N/m$^2$)/($Y_1 = 6.7 \times 10^{10}$ N/m$^2$)], n: 1.066 [($t_2 = 180$ μm)/($t_1 = 170$ μm)].
Applied electric field intensity: 1.10 kV/mm.
Measured values: Displacement at the end tip of cantilever: 580 μm, Generated force: 47 gf.

COMPARATIVE EXAMPLE 5

(Same combination of the materials as in Example 6 except that $t_1$ does not satisfy the formula II)
Type: Unimorph.
Supporting member: alumina.
Piezoelectric element: PZT ceramic element, Y: 0.1788 (same as in Example 6), n: 1.0 [($t_2 = 140$ μm)/($t_1 = 140$ μm)].
Applied electric field intensity: 1.70 kV/mm.
Measured values: Displacement at the end tip of cantilever: 520 μm, Generated force: 46 gf.

It is evident from the foregoing that in each Example of the present invention, a large displacement at the end tip of cantilever and a large generated force are obtainable with a low applied electric field intensity as compared with the Comparative Examples.

Figure 10:
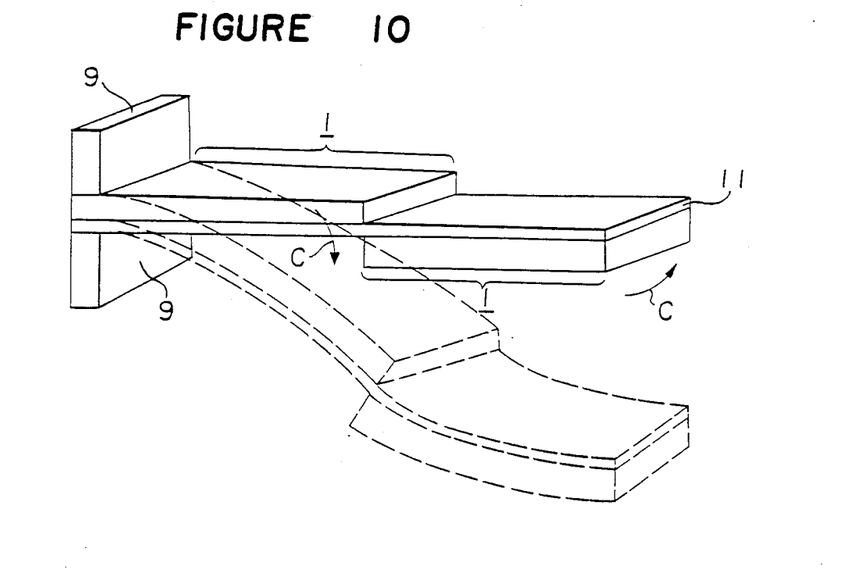
FIG. 10 illustrates a construction wherein two unimorph-type elements are combined to make the forward end portion horizontal.

As the displacement at the end tip of cantilever increases, the forward end portion of cantilever will deflect from the horizontal position. If such deflection is undesirable, it is possible to maintain the forward end portion to be horizontal by arranging two piezoelectric elements 7 against a supporting member 11 as shown in FIG. 10, so that the displacement directions are opposed to each other, whereby the positions after the displacement are as shown by dotted lines.

As described in the foregoing, according to the present invention, a longitudinal effect-type laminated piezoelectric element is formed by laminating piezoelectric ceramic sheets in their thickness direction, and a means for constraining the expansion of the element is provided on one side in the longitudinal direction of the longitudinal effect-type laminated piezoelectric element, whereby the longitudinal effect-type laminated piezoelectric element is used in a bending mode, and it is thereby possible to obtain a piezoelectric strain coefficient of from 2 to 3 times higher than the transversal effect-type piezoelectric actuator of a unimorph-type. Further, the bimorph-type piezoelectric actuator of the present invention has advantages over the conventional bimorph-type and multimorph-type transversal effect-type piezoelectric elements in that it is possible to apply the electric field in the same direction as the polarization direction of the piezoelectric ceramic sheets, whereby a relatively high electric field can be applied without leading to dielectric breakdown and without requiring a means for preventing depolarization, and accordingly it is possible to obtain a large displacement at the end tip of cantilever and a large generated force.

Furthermore, the required intensity of the applied electric field can be substantially reduced by adjusting the Young's modulus $Y_2$ and $Y_1$ of the piezoelectric ceramic element and of the supporting member to be $Y_1 \leq 2.5 Y_2$, the thickness $t_2$ of the piezoelectric element to be 100 μm $\leq t_2 \leq$ 5000 μm and the ratio of $t_1/t_2$ where $t_2$ is the thickness of the piezoelectric element and $t_1$ is the thickness of the supporting member, to be at least 1.6. Accordingly, the generated force and the displacement at the end tip of cantilever can be increased over the conventional levels.

Still further, when the thickness $t_2$ of the piezoelectric ceramic element satisfies the following formula I and the thickness $t_1$ of the supporting member satisfies the following formula II, it is possible to determine the combination of the thicknesses which minimizes the necessary intensity of the applied electric filed once the materials used and the desired displacement at the end tip of cantilever and generated force are determined, whereby it is possible to increase the generated force and the displacement at the end tip of cantilever:

$$100 \; \mu m \leq t_2 \leq 5000 \; \mu m \quad \text{(I)}$$

$$\sqrt{\frac{Y}{2}} \; t_2 \, \mu m \leq t_1 \leq 2\sqrt{Y} \; t_2 \, \mu m \quad \text{(II)}$$

We claim:
1. A piezoelectric actuator comprising a longitudinal effect-type laminated piezoelectric element composed of piezoelectric ceramic sheets, laminated in their thickness direction, and a supporting member made of a ceramic material having a Young's modulus of at least 2.5 times the Young's modulus of the piezoelectric element and fixed to one side in the longitudinal direction of said piezoelectric element and being bendable and capable of constraining expansion of the element, wherein the thickness, $t_2$, of said piezoelectric element is within a range of from 100 μm to 5000 μm, and the ratio of $t_2/t_1$, where $t_2$ is the thickness of said piezoelectric element $t_1$ is the thickness of said supporting member, is at least 1.6.

2. The piezoelectric actuator according to claim 1, wherein the thickness $t_2$ of said piezoelectric element and said thickness $t_1$ of the supporting member satisfy the following formulas I and II, respectively:

$$100 \ \mu m \leq t_2 \leq 5000 \ \mu m \quad (I)$$

$$\sqrt{\frac{Y}{2}} \ t_2 \ \mu m \leq t_1 \leq 2 \sqrt{Y} \ t_2 \ \mu m \quad (II)$$

where $Y = Y_2/Y_1$ where $Y_2$ is the Young's modulus of the piezoelectric element and $Y_1$ is the Young's modulus of the supporting member.

3. The piezoelectric actuator according to claim 1, wherein said supporting member is made of a material selected from the group consisting of alumina, zirconia, magnesium aluminate, beryllia, mullite, cordierite, tungsten carbide, titanium carbide, boron carbide, silicon carbide, silicon nitride, and aluminum nitride.

4. The piezoelectric actuator according to claim 1, wherein said piezoelectric element is made of a ceramic composition containing Pb, Zr and Ti.

5. The piezoelectric actuator according to claim 1, wherein said suppporting member is fixed to said longitudinal effect-type piezoelectric element with an insulating layer interposed therebetween, when at least the surface of the supporting member is electrically conductive.

6. A piezoelectric actuator comprising a longitudinal effect-type laminated piezoelectric element composed of piezoelectric ceramic sheets, laminated in their thickness direction, and a supporting member made of a ceramic material and fixed to one side in the longitudinal direction of said piezoelectric element and being bendable and capable of constraining expansion of said piezoelectric element, wherein the thickness, $t_2$, of said piezoelectric element and the thickness, $t_1$, of said supporting member satisfy the following formulas I and II, respectively:

$$100 \ \mu m \leq t_2 \leq 5000 \ \mu m \quad (I)$$

$$\sqrt{\frac{Y}{2}} \ t_2 \ \mu m \leq t_1 \leq 2 \sqrt{Y} \ t_2 \ \mu m \quad (II)$$

where $Y = Y_2/Y_1$, $Y_2$ is the Young's modulus of said piezoelectric element and $Y_1$ is the Young's modulus of said supporting member.

7. The piezoelectric actuator according to claim 6, wherein said piezoelectric element is made of a ceramic composition containing Pb, Zr and Ti.

8. The piezoelectric actuator according to claim 6, wherein said supporting member is fixed to said longitudinal effect-type piezoelectric element with an insulating layer interposed therebetween, when at least the surface of said supporting member is electrically conductive.

9. The piezoelectric actuator according to claim 6, wherein said supporting member is made of a material selected from the group consisting of alumina, zirconia, magnesium aluminate, beryllia, mullite, cordierite, tungsten carbide, titanium carbide, boron carbide, silicon carbide, silicon nitride and aluminum nitride.

* * * * *